(12) United States Patent
Elbehiery et al.

(10) Patent No.: US 12,042,941 B2
(45) Date of Patent: Jul. 23, 2024

(54) ROBOTIC DATACENTER ASSEMBLY

(71) Applicants: Khaled Elbehiery, Highlands Ranch, CO (US); Hussam Elbehiery, Highlands Ranch, CO (US)

(72) Inventors: Khaled Elbehiery, Highlands Ranch, CO (US); Hussam Elbehiery, Highlands Ranch, CO (US)

( * ) Notice: Subject to any disclaimer, the term of this patent is extended or adjusted under 35 U.S.C. 154(b) by 415 days.

(21) Appl. No.: 17/570,578

(22) Filed: Jan. 7, 2022

(65) Prior Publication Data

US 2023/0219227 A1 Jul. 13, 2023

(51) Int. Cl.
*B25J 5/02* (2006.01)
*B25J 9/00* (2006.01)
*B25J 9/16* (2006.01)
*H05K 7/14* (2006.01)

(52) U.S. Cl.
CPC ............. *B25J 9/1682* (2013.01); *B25J 5/02* (2013.01); *B25J 9/0084* (2013.01); *H05K 7/1497* (2013.01)

(58) Field of Classification Search
CPC .......... B25J 5/02; B25J 9/0018; B25J 9/0084; G05B 2219/40252; G05B 2219/45084
See application file for complete search history.

(56) References Cited

U.S. PATENT DOCUMENTS

| | | | |
|---|---|---|---|
| 9,908,239 B1 | 3/2018 | O'Brien | |
| 10,349,152 B2 | 7/2019 | Adiletta | |
| 10,780,590 B2 | 9/2020 | Gold | |
| D911,407 S | 2/2021 | Jia | |
| 10,908,128 B2 * | 2/2021 | Simpson | G01N 29/265 |
| 10,935,980 B2 | 3/2021 | Mukherjee | |
| 11,415,967 B2 * | 8/2022 | Gentile | G05B 19/41805 |
| 11,438,524 B2 * | 9/2022 | Moore | H04N 23/695 |
| 11,650,598 B2 * | 5/2023 | Kewitsch | G02B 6/255 |
| | | | 235/451 |
| 11,890,707 B2 * | 2/2024 | Wu | B23P 19/04 |
| 2016/0236865 A1 | 8/2016 | Altemir | |
| 2020/0277139 A1 | 9/2020 | Nakano | |
| 2021/0039258 A1 | 2/2021 | Meyers | |

FOREIGN PATENT DOCUMENTS

WO  WO2018017252  1/2018

* cited by examiner

*Primary Examiner* — Dalena Tran

(57) ABSTRACT

A robotic datacenter assembly includes a datacenter which stores a plurality of data storage units. A rail system is integrated into the datacenter and the rail system is positioned adjacent to the ceiling such that the rail system is spaced above the plurality of data storage units. An operational command unit is positioned in the datacenter and the operational command unit stores a database which includes robotic operational software. A plurality of drive units each movably engages the rail system such that each of the drive units can travel along the rail system. A plurality of robotic arms is each integrated into a respective one of the drive units having each of the robotic arms extending downwardly from the rail system. Each of the robotic arms is actuatable to manipulate any of the data storage units thereby facilitating hardware in any of the data storage units to be serviced or replaced by the robotic arms.

8 Claims, 3 Drawing Sheets

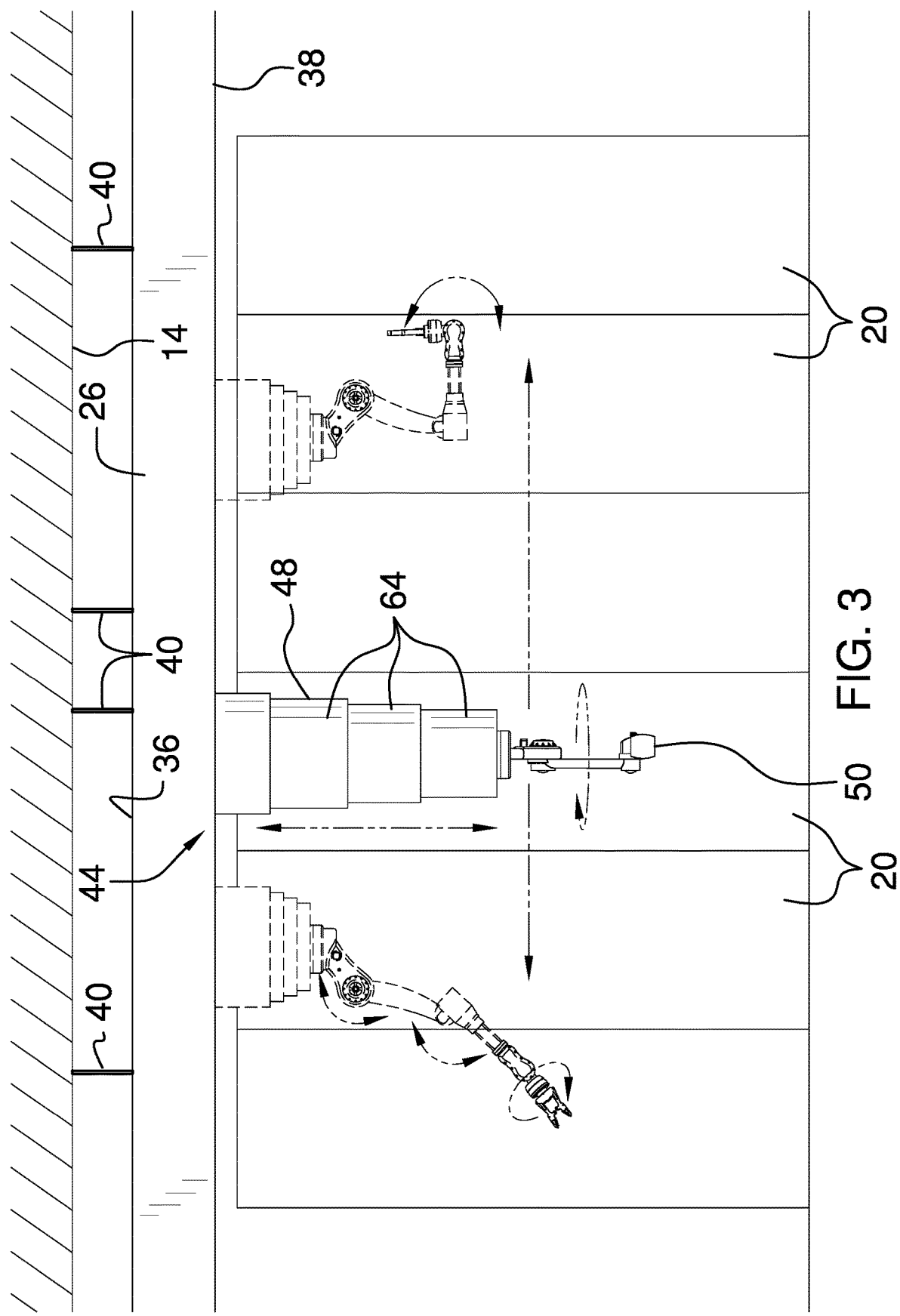

ROBOTIC DATACENTER ASSEMBLY

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM

Not Applicable

STATEMENT REGARDING PRIOR DISCLOSURES BY THE INVENTOR OR JOINT INVENTOR

Not Applicable

BACKGROUND OF THE INVENTION

(1) Field of the Invention

The disclosure relates to datacenter devices and more particularly pertains to a new datacenter device for autonomously maintaining and servicing data storage units in a datacenter. The device includes a rail system and a plurality of drive units that are each movably integrated into the rail system. The device includes a plurality of robotic arms that are each disposed on a respective drive unit. Each of the robotic arms can maintain and service hardware in the data storage units.

(2) Description of Related Art Including Information Disclosed Under 37 CFR 1.97 and 1.98

The prior art relates to datacenter devices including a mobile robotic device that includes a motorized cart and a robotic arm disposed on the motorized cart for maintaining and repairing hardware in a data storage unit. The prior art discloses a rack system to facilitate robotic maintenance on devices in the rack system which includes a plurality of sleds that are slidably integrated into the rack system. The prior art discloses a robotic datacenter unit that includes a vertically oriented frame and a robotic arm that is movably integrated into the vertically oriented frame for removing and replacing modules in a data storage unit positioned in front of the vertically oriented frame. The prior art discloses a shelving unit that has a robotic arm being movably integrated into the shelving unit.

BRIEF SUMMARY OF THE INVENTION

An embodiment of the disclosure meets the needs presented above by generally comprising a datacenter which stores a plurality of data storage units. A rail system is integrated into the datacenter and the rail system is positioned adjacent to the ceiling such that the rail system is spaced above the plurality of data storage units. An operational command unit is positioned in the datacenter and the operational command unit stores a database which includes robotic operational software. A plurality of drive units each movably engages the rail system such that each of the drive units can travel along the rail system. A plurality of robotic arms is each integrated into a respective one of the drive units having each of the robotic arms extending downwardly from the rail system. Each of the robotic arms is actuatable to manipulate any of the data storage units thereby facilitating hardware in any of the data storage units to be serviced or replaced by the robotic arms.

There has thus been outlined, rather broadly, the more important features of the disclosure in order that the detailed description thereof that follows may be better understood, and in order that the present contribution to the art may be better appreciated. There are additional features of the disclosure that will be described hereinafter and which will form the subject matter of the claims appended hereto.

The objects of the disclosure, along with the various features of novelty which characterize the disclosure, are pointed out with particularity in the claims annexed to and forming a part of this disclosure.

BRIEF DESCRIPTION OF SEVERAL VIEWS OF THE DRAWING(S)

The disclosure will be better understood and objects other than those set forth above will become apparent when consideration is given to the following detailed description thereof. Such description makes reference to the annexed drawings wherein:

FIG. 3 is a perspective in-use view of an embodiment of the disclosure.

DETAILED DESCRIPTION OF THE INVENTION

Figure 1:
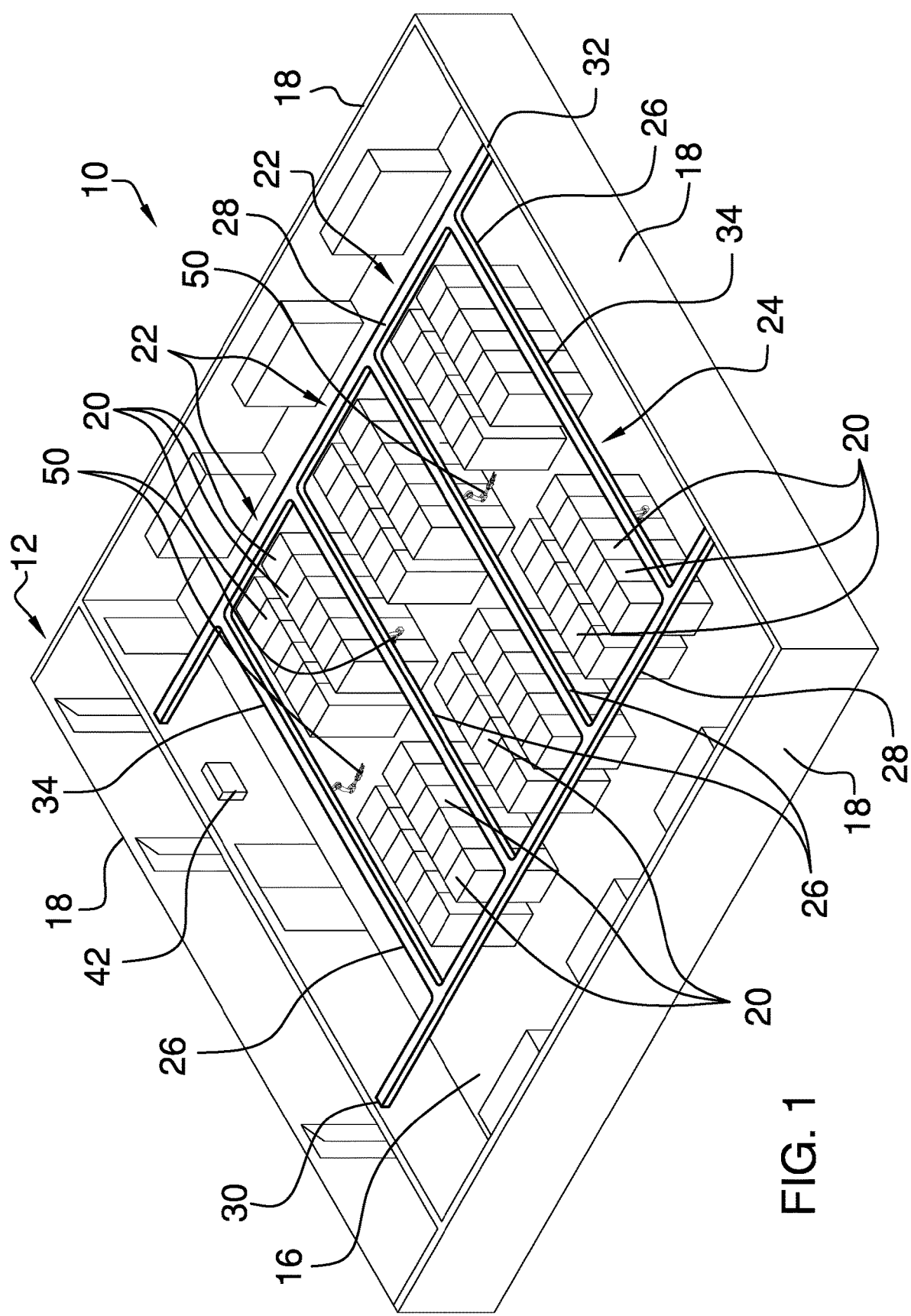
FIG. 1 is a top perspective view of a robotic datacenter assembly according to an embodiment of the disclosure.
Figure 2:
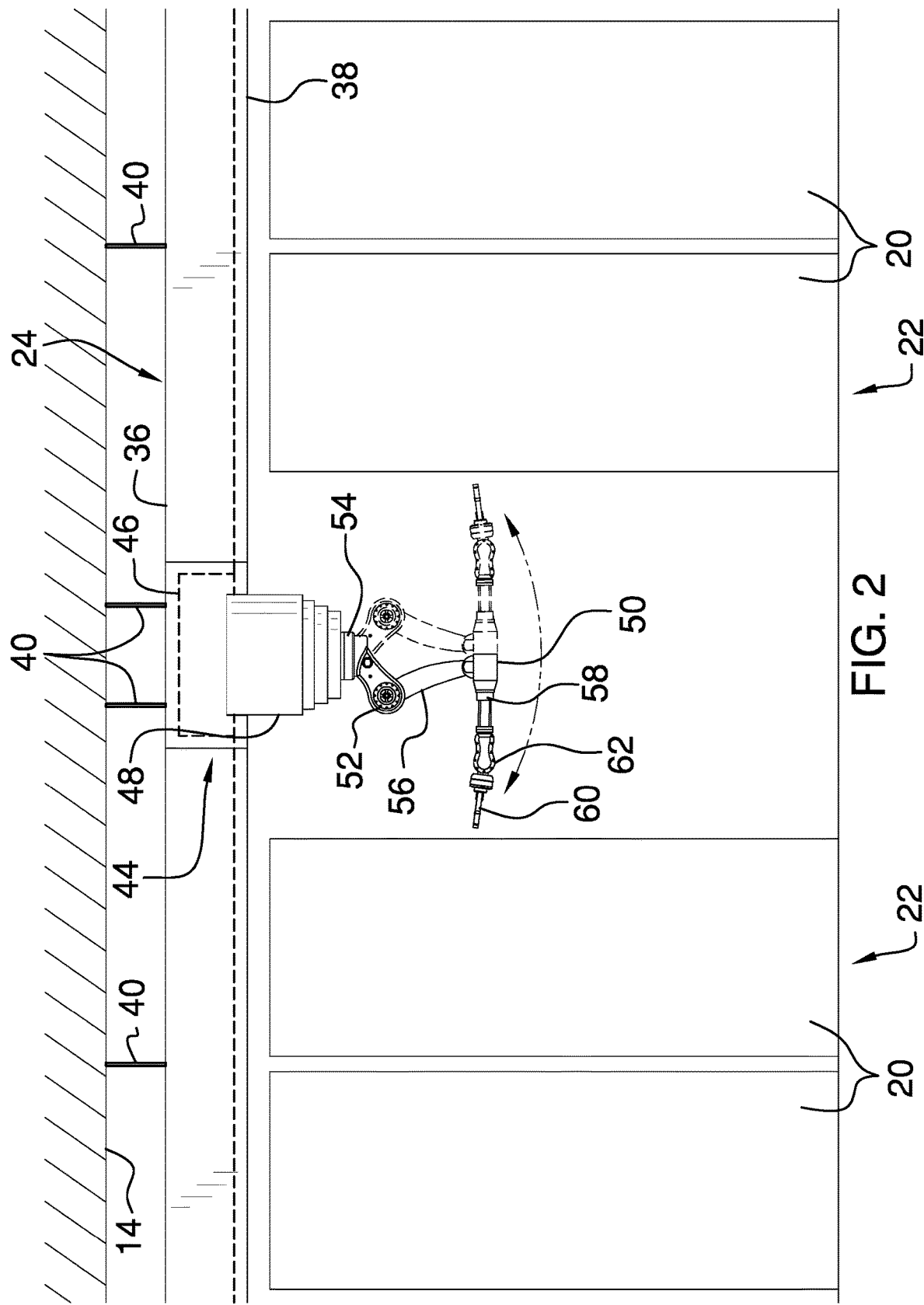
FIG. 2 is a front phantom view of an embodiment of the disclosure.

With reference now to the drawings, and in particular to FIGS. 1 through 3 thereof, a new datacenter device embodying the principles and concepts of an embodiment of the disclosure and generally designated by the reference numeral 10 will be described.

As best illustrated in FIGS. 1 through 3, the robotic datacenter assembly 10 generally comprises a datacenter 12 has a ceiling 14, a floor 16 and a plurality of exterior walls 18. The datacenter 12 includes a plurality of data storage units 20 and the plurality of data storage units 20 is arranged in a plurality of rows 22 in the datacenter 12. The plurality of data storage units 20 may comprise web servers or other digital data storage devices. Additionally, the data storage units 20 may include routers and other digital communication hardware.

A rail system 24 is integrated into the datacenter 12 and the rail system 24 is positioned adjacent to the ceiling 14 such that the rail system 24 is spaced above the plurality of data storage units 20. The rail system 24 includes a plurality of cross rails 26 each extending between a pair of support rails 28. The cross rails 26 are spaced apart from each other and are distributed along a substantial length of the support rails 28. Each of the support rails 28 has a first end 30 and a second end 32; the first end 30 and the second end 32 of each of the support rails 28 is coupled to a respective one of the exterior walls 18 of the datacenter 12 such that each of the cross rails 26 and each of the support rails 28 lies on a horizontal plane. Furthermore, each of the cross rails 26 is oriented to extend between a respective pair of the rows 22 of the data storage units 20.

The plurality of cross rails 26 includes a pair of outer cross rails 34 that is each oriented to extend between a respective one of the rows 22 of the data storage units 20 and a respective exterior wall 18 of the datacenter 12. Additionally, each of the cross rails 26 and each of the support rails 28 has a top surface 36 and a bottom surface 38. The rail system 24 may be installed in the datacenter 12 during the construction phase of the datacenter 12 or the rail system 24 may be retrofitted into an existing datacenter 12. Additionally, the cross rails 26 and support rails 28 may be custom built to match the design of the existing datacenter 12.

A plurality of hangers 40 is provided and each of the hangers 40 is coupled between the top surface of a respective one of the cross rails 26 or the support rails 28 and the ceiling 14 of the datacenter 12 such that the rail system 24 is suspended from the ceiling 14. The hangers 40 are spaced apart from each other and are distributed along the cross rails 26 and the support rails 28. An operational command unit 42 is positioned in the datacenter 12. The operational command unit 42 stores a database including the physical location of each of the data storage units 20 in the datacenter 12 with respect to the rail system 24. Additionally, the database includes robotic operational software.

A plurality of drive units 44 is provided and each of the drive units 44 movably engages the rail system 24 such that each of the drive units 44 can travel along the rail system 24. Each of the drive units 44 includes a drive portion 46 which engages the bottom surface 38 of any of the cross rails 26 or the support rails 28. The drive portion 46 of each of the drive units 44 might include an electric motor and a series of gears, or any other type of electromechanical propulsion system, which facilitates the drive portion 46 to travel in any direction along a dual axis. Each of the drive units 44 includes a mount portion 48 which extends downwardly from the drive portion 46. The drive portion 46 of each of the drive units 44 is in communication with the operational command unit 42. Furthermore, the drive portion 46 of each of the drive units 44 receives directional commands from the operational command unit 42.

A plurality of robotic arms 50 is provided and each of the robotic arms 50 is integrated into a respective one of the drive units 44 having each of the robotic arms 50 extending downwardly from the rail system 24. Each of the robotic arms 50 is actuatable to manipulate any of the data storage units 20 thereby facilitating hardware in any of the data storage units 20 to be serviced or replaced by the robotic arms 50. Each of the robotic arms 50 includes an upper portion 52 extending downwardly from a distal end 54 of the mount portion 48 of a respective one of the drive units 44.

Additionally, each of the robotic arms 50 includes a middle portion 56 that is pivotally engaged to the upper portion 52 and a lower portion 58 that is pivotally engaged to the middle portion 56. Each of the robotic arms 50 includes a grip portion 60 that is pivotally engaged to a distal end 62 of the lower portion 58. Each of upper portion 52, the middle portion 56, the lower portion 58 and the grip portion 60 of each of the robotic arms 50 is articulated according to operational commands received from the operational command unit 42. In this way the robotic arms 50 can service and replace the hardware in the data storage units 20. Each of the robotic arms 50 might include servos, or electric motors, or hydraulic actuators or any other type of mechanical motion common to robotic systems. As is most clearly shown in FIG. 3, the mount portion 48 of each of the drive units 44 may comprise a plurality of telescopic sections 64 that can either be lengthened or shortened with respect to the rail system 24. In this way the robotic arms 50 can be moved upwardly and downwardly to facilitate full access to the data storage units 20.

In use, the drive units 44 and the robotic arms 50 are driven according to operational commands received from the operational command unit 42. In this way the robotic arms 50 can service, or replace, hardware associated with the data storage units 20. Thus, the datacenter 12 can be maintained without the physical presence of a technician. In this way the datacenter 12 can remain fully functional during a pandemic, for example, or other situation that could potentially reduce or eliminate the physical presence of a technician in the datacenter 12. Additionally, a physically disabled technician, for example, can facilitate maintenance and repair of the hardware in the data storage units 20 from a control center that is in communication with the operational command unit 42. In this way the data storage units 20 can be remotely maintained and repaired.

With respect to the above description then, it is to be realized that the optimum dimensional relationships for the parts of an embodiment enabled by the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by an embodiment of the disclosure.

Therefore, the foregoing is considered as illustrative only of the principles of the disclosure. Further, since numerous modifications and changes will readily occur to those skilled in the art, it is not desired to limit the disclosure to the exact construction and operation shown and described, and accordingly, all suitable modifications and equivalents may be resorted to, falling within the scope of the disclosure. In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be only one of the elements.

We claim:

1. A robotic datacenter assembly for installing and maintaining data hardware in an automated and autonomous fashion, said assembly comprising:

a datacenter storing a plurality of data storage units;

a rail system being integrated into said datacenter, said rail system being positioned adjacent to said ceiling such that said rail system is spaced above said plurality of data storage units;

an operational command unit being positioned in said datacenter, said operational command unit storing a database including the physical location of each of said data storage units in said datacenter with respect to said rail system, said database including robotic operational software;

a plurality of drive units, each of said drive units movably engaging said rail system such that each of said drive units can travel along said rail system; and a plurality of robotic arms, each of said robotic arms being integrated into a respective one of said drive units having each of said robotic arms extending downwardly from said rail system, each of said robotic arms being actuatable to manipulate any of said data storage units thereby facilitating hardware in any of said data storage units to be serviced or replaced by said robotic arms.

2. The assembly according to claim 1, wherein:
said datacenter has a ceiling, a floor and a plurality of exterior walls;
said plurality of data storage units is arranged in a plurality of rows in said datacenter;
said rail system includes a plurality of cross rails each extending between a pair of support rails, said cross rails being spaced apart from each other and being distributed along a substantial length of said support rails;
each of said support rails has a first end and a second end, said first end and said second end of each of said support rails being coupled to a respective one of said exterior walls of said datacenter such that each of said cross rails and each of said support rails lies on a horizontal plane;
each of said cross rails is oriented to extend between a respective pair of said rows of said data storage units;
said plurality of cross rails includes a pair of outer cross rails, each of said outer cross rails being oriented to extend between a respective one of said rows of said data storage units and a respective exterior wall of said datacenter; and
each of said cross rails and each of said support rails has a top surface and a bottom surface.

3. The assembly according to claim 2, further comprising a plurality of hangers, each of said hangers being coupled between said top surface of a respective one of said cross rails or said support rails and said ceiling of said datacenter such that said rail system is suspended from said ceiling, said hangers being spaced apart from each other and being distributed along said cross rails and said support rails.

4. The assembly according to claim 2, wherein each of said drive units includes a drive portion which engages said bottom surface of any of said cross rails or said support rails, each of said drive units including a mount portion extending downwardly from said drive portion, said drive portion of each of said drive units being in communication with said operational command unit, said drive portion of each of said drive units receiving directional commands from said operational command unit.

5. The assembly according to claim 4, wherein each of said robotic arms includes an upper portion extending downwardly from a distal end of said mount portion of a respective one of said drive units, each of said robotic arms including a middle portion being pivotally engaged to said upper portion and a lower portion being pivotally engaged to said middle portion.

6. The assembly according to claim 5, wherein each of said robotic arms includes a grip portion being pivotally engaged to a distal end of said lower portion, each of upper portion, said middle portion, said lower portion and said grip portion of each of said robotic arms being articulated according to operational commands received from said operational command unit thereby facilitating said robotic arms to service and replace said hardware in said data storage units.

7. A robotic datacenter assembly for installing and maintaining data hardware in an automated and autonomous fashion, said assembly comprising:
a datacenter having a ceiling, a floor and a plurality of exterior walls, said datacenter including a plurality of data storage units, said plurality of data storage units being arranged in a plurality of rows in said datacenter;
a rail system being integrated into said datacenter, said rail system being positioned adjacent to said ceiling such that said rail system is spaced above said plurality of data storage units, said rail system including a plurality of cross rails each extending between a pair of support rails, said cross rails being spaced apart from each other and being distributed along a substantial length of said support rails, each of said support rails having a first end and a second end, said first end and said second end of each of said support rails being coupled to a respective one of said exterior walls of said datacenter such that each of said cross rails and each of said support rails lies on a horizontal plane, each of said cross rails being oriented to extend between a respective pair of said rows of said data storage units, said plurality of cross rails including a pair of outer cross rails, each of said outer cross rails being oriented to extend between a respective one of said rows of said data storage units and a respective exterior wall of said datacenter, each of said cross rails and each of said support rails having a top surface and a bottom surface;
a plurality of hangers, each of said hangers being coupled between said top surface of a respective one of said cross rails or said support rails and said ceiling of said datacenter such that said rail system is suspended from said ceiling, said hangers being spaced apart from each other and being distributed along said cross rails and said support rails;
an operational command unit being positioned in said datacenter, said operational command unit storing a database including the physical location of each of said data storage units in said datacenter with respect to said rail system, said database including robotic operational software;
a plurality of drive units, each of said drive units movably engaging said rail system such that each of said drive units can travel along said rail system, each of said drive units including a drive portion which engages said bottom surface of any of said cross rails or said support rails, each of said drive units including a mount portion extending downwardly from said drive portion, said drive portion of each of said drive units being in communication with said operational command unit, said drive portion of each of said drive units receiving directional commands from said operational command unit; and
a plurality of robotic arms, each of said robotic arms being integrated into a respective one of said drive units having each of said robotic arms extending downwardly from said rail system, each of said robotic arms being actuatable to manipulate any of said data storage units thereby facilitating hardware in any of said data storage units to be serviced or replaced by said robotic arms, each of said robotic arms including an upper portion extending downwardly from a distal end of said mount portion of a respective one of said drive units, each of said robotic arms including a middle portion being pivotally engaged to said upper portion and a lower portion being pivotally engaged to said middle portion, each of said robotic arms including a grip portion being pivotally engaged to a distal end of said lower portion, each of upper portion, said middle portion, said lower portion and said grip portion of each of said robotic arms being articulated according to operational commands received from said operational command unit thereby facilitating said robotic arms to service and replace said hardware in said data storage units.

8. A robotic datacenter system for installing and maintaining data hardware in an automated and autonomous fashion, said system comprising:

a control center having at least one technician;

a datacenter having a ceiling, a floor and a plurality of exterior walls, said datacenter including a plurality of data storage units, said plurality of data storage units being arranged in a plurality of rows in said datacenter;

a rail system being integrated into said datacenter, said rail system being positioned adjacent to said ceiling such that said rail system is spaced above said plurality of data storage units, said rail system including a plurality of cross rails each extending between a pair of support rails, said cross rails being spaced apart from each other and being distributed along a substantial length of said support rails, each of said support rails having a first end and a second end, said first end and said second end of each of said support rails being coupled to a respective one of said exterior walls of said datacenter such that each of said cross rails and each of said support rails lies on a horizontal plane, each of said cross rails being oriented to extend between a respective pair of said rows of said data storage units, said plurality of cross rails including a pair of outer cross rails, each of said outer cross rails being oriented to extend between a respective one of said rows of said data storage units and a respective exterior wall of said datacenter, each of said cross rails and each of said support rails having a top surface and a bottom surface;

a plurality of hangers, each of said hangers being coupled between said top surface of a respective one of said cross rails or said support rails and said ceiling of said datacenter such that said rail system is suspended from said ceiling, said hangers being spaced apart from each other and being distributed along said cross rails and said support rails;

an operational command unit being positioned in said datacenter, said operational command unit storing a database including the physical location of each of said data storage units in said datacenter with respect to said rail system, said database including robotic operational software, said operational command unit being in communication with said control center wherein said operational command unit is configured to receive operational commands from the technician;

a plurality of drive units, each of said drive units movably engaging said rail system such that each of said drive units can travel along said rail system, each of said drive units including a drive portion which engages said bottom surface of any of said cross rails or said support rails, each of said drive units including a mount portion extending downwardly from said drive portion, said drive portion of each of said drive units being in communication with said operational command unit, said drive portion of each of said drive units receiving directional commands from said operational command unit; and a plurality of robotic arms, each of said robotic arms being integrated into a respective one of said drive units having each of said robotic arms extending downwardly from said rail system, each of said robotic arms being actuatable to manipulate any of said data storage units thereby facilitating hardware in any of said data storage units to be serviced or replaced by said robotic arms, each of said robotic arms including an upper portion extending downwardly from a distal end of said mount portion of a respective one of said drive units, each of said robotic arms including a middle portion being pivotally engaged to said upper portion and a lower portion being pivotally engaged to said middle portion, each of said robotic arms including a grip portion being pivotally engaged to a distal end of said lower portion, each of upper portion, said middle portion, said lower portion and said grip portion of each of said robotic arms being articulated according to operational commands received from said operational command unit thereby facilitating said robotic arms to service and replace said hardware in said data storage units.

* * * * *